(12) United States Patent
Loibl et al.

(10) Patent No.: US 9,769,945 B2
(45) Date of Patent: Sep. 19, 2017

(54) COVERING DEVICE FOR A CONTACTING PORTION OF A PRINTED CIRCUIT BOARD, CONTROL SYSTEM FOR A MECHATRONIC MODULE AND METHOD FOR ASSEMBLING A CONTROL SYSTEM

(71) Applicant: ZF Friedrichshafen AG, Friedrichshafen (DE)

(72) Inventors: Josef Loibl, Bad Abbach (DE); Herbert Wallner, Auerbach (DE); Roland Friedl, Auerbach (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 328 days.

(21) Appl. No.: 14/385,093

(22) PCT Filed: Feb. 1, 2013

(86) PCT No.: PCT/EP2013/051993
§ 371 (c)(1),
(2) Date: Sep. 12, 2014

(87) PCT Pub. No.: WO2013/135429
PCT Pub. Date: Sep. 19, 2013

(65) Prior Publication Data
US 2015/0098193 A1 Apr. 9, 2015

(30) Foreign Application Priority Data
Mar. 14, 2012 (DE) .................. 10 2012 204 004

(51) Int. Cl.
*H05K 1/11* (2006.01)
*H05K 5/03* (2006.01)
(Continued)

(52) U.S. Cl.
CPC ............. *H05K 5/03* (2013.01); *H01R 13/521* (2013.01); *H01R 13/5202* (2013.01);
(Continued)

(58) Field of Classification Search
CPC ....................... H01R 23/6886; H01R 23/6893; H01R 23/70; H01R 23/701; H01R 23/7015; H01R 12/72; H01R 13/6587; H01R 23/7073
(Continued)

(56) References Cited

U.S. PATENT DOCUMENTS 5,161,092 A * 11/1992 Smith .................. H05K 3/0061
165/185
5,299,097 A 3/1994 Kondo et al.
(Continued)

FOREIGN PATENT DOCUMENTS

DE 40 23 319 C1 12/1991
DE 42 28 818 A1 3/1994
(Continued)

OTHER PUBLICATIONS

International Search Report issued Apr. 17, 2013 in International Application No. PCT/EP2013/051993 (3 pages).
(Continued)

*Primary Examiner* — Binh Tran
(74) *Attorney, Agent, or Firm* — Brinks Gilson & Lione

(57) ABSTRACT

A cover device for a contact section of a printed circuit board for a mechatronics module is proposed. The printed circuit board includes a contact section which has at least one connection hole, for connecting an electrical connection element to the printed circuit board. The cover device is characterized in that the cover device has a voltage protection element and a sealing element for sealing the at least one connection hole. The sealing element has at least one
(Continued)

Figure 1:
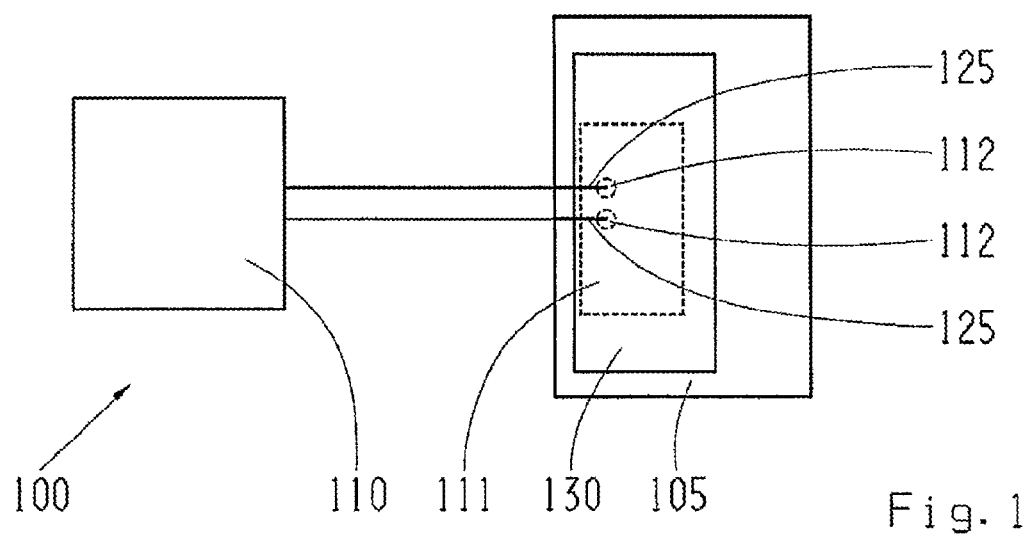

blind hole thereby, for receiving an end section of the electrical connection element.

12 Claims, 2 Drawing Sheets

(51) Int. Cl.

| | | |
|---|---|---|
| *H01R 13/52* | (2006.01) | |
| *H05K 5/00* | (2006.01) | |
| *H01R 43/20* | (2006.01) | |
| *H05K 7/14* | (2006.01) | |
| *H01R 29/00* | (2006.01) | |
| *H01R 12/00* | (2006.01) | |
| *H01R 13/62* | (2006.01) | |
| *H01R 13/648* | (2006.01) | |
| *H01R 12/50* | (2011.01) | |
| *H01R 12/72* | (2011.01) | |
| *H01R 13/6587* | (2011.01) | |
| *H01R 12/58* | (2011.01) | |

(52) U.S. Cl.
CPC ......... *H01R 43/205* (2013.01); *H05K 5/0082* (2013.01); *H05K 7/14* (2013.01); *H01R 12/58* (2013.01); *H01R 12/72* (2013.01); *H01R 13/6587* (2013.01); *H01R 23/6886* (2013.01); *H01R 23/6893* (2013.01); *H01R 23/70* (2013.01); *H01R 23/701* (2013.01); *H01R 23/7015* (2013.01); *H01R 23/7073* (2013.01); *Y10T 29/49147* (2015.01)

(58) Field of Classification Search
USPC ...... 361/784, 785, 791, 803; 439/45, 55, 59, 439/62, 325, 607.39, 607.4
See application file for complete search history.

(56) References Cited

U.S. PATENT DOCUMENTS

| | | |
|---|---|---|
| 2007/0008709 A1 | 1/2007 | Ikeya et al. |
| 2007/0270001 A1 | 11/2007 | Matsumura |
| 2009/0103276 A1* | 4/2009 | Sakamoto ............. H05K 1/144 361/792 |
| 2012/0052696 A1 | 3/2012 | Tay et al. |

FOREIGN PATENT DOCUMENTS

| | | |
|---|---|---|
| DE | 197 41 603 A1 | 3/1999 |
| DE | 10 2005 043 033 B3 | 4/2007 |
| DE | 10 2006 027 748 A1 | 12/2007 |
| EP | 1 403 967 A2 | 3/2004 |
| FR | 2 905 035 A1 | 2/2008 |

OTHER PUBLICATIONS

International Search Report and Written Opinion from corresponding International Patent Application PCT/EP2013/051993, dated Apr. 17, 2013 (German Language) (12 pages).

Office Action dated Feb. 21, 2013 from corresponding DE 10 2012 204 004.8 (5 pages).

\* cited by examiner

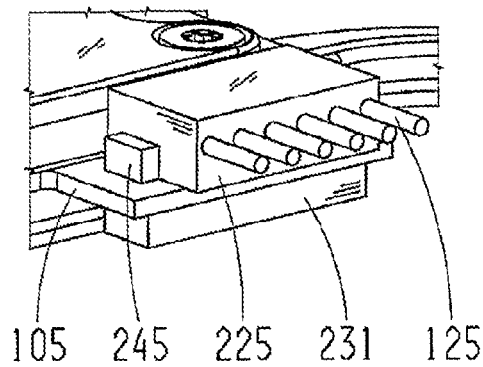
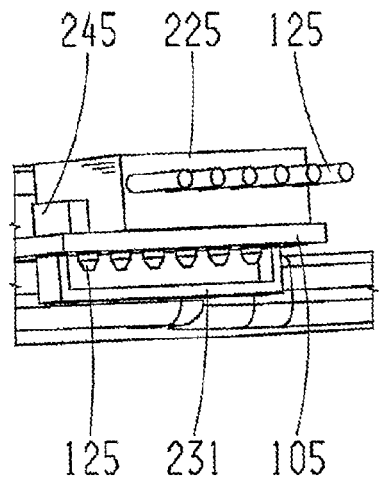
Fig. 4A  Fig. 4B
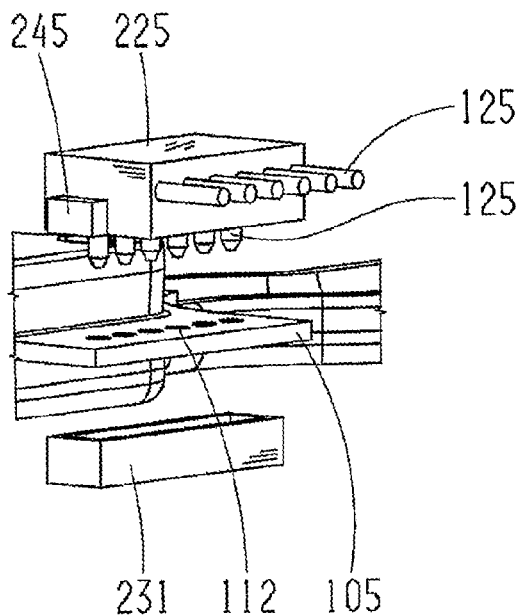
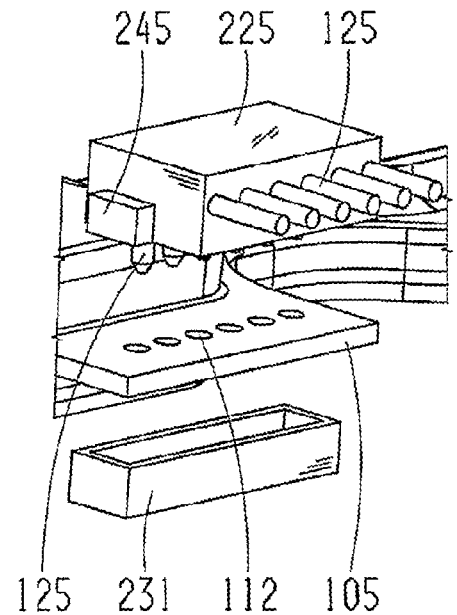
Fig. 4C  Fig. 4D

COVERING DEVICE FOR A CONTACTING PORTION OF A PRINTED CIRCUIT BOARD, CONTROL SYSTEM FOR A MECHATRONIC MODULE AND METHOD FOR ASSEMBLING A CONTROL SYSTEM

This application is a filing under 35 U.S.C. §371 of International Patent Application PCT/EP2013/051993, filed Feb. 1, 2013, and claims the priority of DE 10 2012 204 004.8, filed Mar. 14, 2012. These applications are incorporated by reference herein in their entirety.

The present invention relates to a cover device for a contact section of a printed circuit board for a mechatronics module, a control system for a mechatronics module, a use of a sealing element, and a method for assembling a control system for a mechatronics module.

A mechatronics module, e.g. an integrated transmission control or a steering control, normally consists of a unit having numerous components, such as electronics, sensors, actuators and connectors, that are electrically and mechanically connected. A transmission control for vehicle transmissions comprises a central electronic control unit, with the peripheral modules, or further control assemblies, such as sensors, valves or connectors, for connecting to a connector on other vehicle systems. With an electronics assembly, which is assembled with a ceramics based hybrid technology, the linking of individual sensors, or actuators, respectively, can be obtained by means of laser welding PI films, heavy wire bonding of films (flexible conductors) or laser welding of lead frames on metal pins, which are fitted onto an electronic control unit (E-box). A printed circuit board is defined as an interconnect device for the electronic control unit. Furthermore, it is possible to obtain a linking of peripheral modules via a direct connector. For this, modules, for example, consisting of numerous wires, which are contained in a connector housing, are brought into contact with the printed circuit board in that the ends of the connectors, or modules, respectively, are plugged into the printed circuit board.

DE 10 2006 027 748 A1 discloses a printed circuit board and a method for producing a solderless electrical connection.

With this background, the present invention provides an improved cover device for a contact section of a printed circuit board for a mechatronics module, an improved control system for a mechatronics module, a use of a sealing element, and an improved method for assembling a control system for a mechatronics module, in accordance with the independent claims. Advantageous designs can be derived from the dependent claims and the following description.

According to embodiments of the invention, a contact section of a printed circuit board, on which, for example, peripheral modules and suchlike can be electrically connected to the printed circuit board via an electrical connection element, and can be covered and sealed by means of a cover device having a sealing element and a voltage protection element. In particular, blind holes can be provided in the sealing element of the cover device for receiving sections of the electrical connection elements protruding above the printed circuit board.

This enables protection for electrical connection points, such as soldering or insertion points, against the surrounding, in part aggressive, media, that is easy to implement. Thus, a use of simple and cost-effective components, e.g. elastomer components in the form of mats or suchlike is possible, wherein no additional socketing processes or suchlike are necessary in order to obtain a sealing effect. A use of, for example, a gasket can also be avoided thereby, which would be expensive to produce, and would be complex and expensive in terms of the processing technology with respect to the number of modules, or connectors, respectively, attached to the printed circuit board. In order to obtain an electrical contact to the printed circuit board, simple manufacturing processes, such as insertion or soldering, can thus be used. Because of the cover device, the contacting can also be implemented in adverse situations. Thus, according to embodiments of the present invention, it can be ensured that a medium in the surroundings, such as transmission fluid and potential particles for example, cannot end up on the connection points. In this manner, it can be reliably ensured that the danger of short circuits and malfunctions, e.g. due to corrosion, is prevented, wherein the cover device can securely, readily, and inexpensively seal the contact section of the printed circuit board.

The present invention provides a cover device for a contact section of a printed circuit board for a mechatronics module, wherein the contact section has at least one connection hole for connecting an electrical connection element to the printed circuit board, characterized in that the cover device has a voltage protection element and a sealing element for sealing the at least one connection hole, wherein the sealing element has a least one blind hole for receiving an end section of the at least one electrical connection element.

The mechatronics module can, for example, be part of a vehicle transmission, or a transmission control unit for a vehicle, respectively. The vehicle transmission can be a direct shift gearbox or an automatic transmission. The vehicle transmission can be intended for a vehicle, which may be a motor vehicle, such as a passenger car or a truck. The printed circuit board can be a circuit board having electrical circuitry, conductor paths and connection surfaces. The printed circuit board can be a part of a control device for the mechatronics module. The control device can assume a central function in the transmission control thereby. An electrical circuitry can be disposed on the printed circuit board. For this, the electrical circuitry can implement central control components for controlling the mechatronics module. For this purpose, electrical components are disposed in a component section of the printed circuit board. The printed circuit board has a contact section, in which the at least one connection hole is disposed. The at least one connection hole on the printed circuit board can be disposed in an edge section of the printed circuit board. An edge section can be understood to mean a longitudinal region along at least one edge of the printed circuit board. The at least one connection hole can be a metal plated through hole. The at least one connection hole can extend from a first main surface of the printed circuit board to a second main surface of the printed circuit board lying opposite the first main surface. The at least one connection hole can be electrically connected to the electrical circuitry on the printed circuit board by means of a conductor path. The electrical connection element can be a contact pin of a connector, a plug module or suchlike, a cable, a wire, a cord, or some other electrical connection. The end section of the at least one electrical connection element can protrude from the connection hole. The voltage protection element can have a cover element, a lid, a cap or suchlike. The voltage protection element can be made of a plastic or a metal, or suchlike. The voltage protection element can be designed to cover the contact section of the printed circuit board and the end section of the at least one electrical connection element. The voltage protection element can, for example, be glued, injected, locked in place, hot-glued, or screwed onto the printed circuit board. The voltage protection element can be designed as an individual part or as an extension of the electronics base plate, made of metal, e.g. sheet metal or aluminum pressure casting. The sealing element is designed to achieve a sealing of the contact section of the printed circuit board. The sealing element can be designed to form a seal around the at least one connection hole, or the end section of the at least one electrical connection element. The at least one blind hole can have the shape of a recess in terms of its design. The blind hole can have a base, thus not being a through hole. The at least one blind hole can have a circumference, a depth and/or a profile, which are designed to receive the end section of the at least one electrical connection element extending from the at least one connection hole. The at least one blind hole can have a circumference that is designed to encompass the at least one connection hole.

For this, the sealing element can be disposed between the voltage protection element and a first main surface of the printed circuit board. The sealing element can be designed to form a seal for the contact section on the first main surface of the printed circuit board. The sealing element can be designed to form a seal between the voltage protection element and the contact section on the first main surface of the printed circuit board surrounding the at least one connection hole, or the end section of the at least one electrical connection element, respectively. The first main surface of the printed circuit board is a main surface thereby, from which the end section of the at least one electrical connection element protrudes. An embodiment of this type offers the advantage that a covering effect and a sealing effect by the cover device can be improved, and thus a protection from contaminants, short circuits and suchlike can be increased.

The voltage protection element can also have a covering space opening toward the printed circuit board when it is attached to the printed circuit board, in which the sealing element can, at least in part, be accommodated. The covering space can be designed such that it is open on one side. When it has been attached to the printed circuit board, a circumferential edge of the voltage protection element, which encompasses the open side of the covering space, can rest on the printed circuit board, or can face the printed circuit board. The circumferential edge of the open side of the covering space can encompass a base surface, which corresponds to at least an area of the contact section of the printed circuit board on the first main surface. In the not yet assembled state, the sealing element can extend partially from the covering space. When installed on the printed circuit board, the sealing element can be entirely accommodated in the covering space of the voltage protection element. An embodiment of this type offers the advantage that the voltage protection element and the sealing element can be attached to the printed circuit board in a defined positional relation relative to one another, collectively if applicable. Thus, a covering, as well as sealing, function of the cover device can be achieved in a secure, precisely positioned and efficient manner.

In particular, the sealing element can have a sealing mat made of an elastomer material. The sealing element can be pressed onto the contact section of the printed circuit board thereby. An embodiment of this type offers the advantage that the sealing function of the cover device is particularly cost-effective and simple, or can be fulfilled with a low assembly effort, respectively.

According to one embodiment, a further sealing element for sealing the at least one connection hole can be provided. The further sealing element can have a hole through which the electrical connection element can pass. Furthermore, the printed circuit board can be disposed between the further sealing element and the sealing element. In this manner, the further sealing element can be pressed onto the second main surface of the printed circuit board lying opposite the first main surface. When the further sealing element has been attached to the printed circuit board, the at least one through hole in the further sealing element is disposed in the region of the at least one connection hole in the contact section of the printed circuit board. Thus, the further sealing element can be designed to form a seal between a connector device exhibiting the at least one electrical connection element or suchlike, and a main surface of the printed circuit board surrounding the at least one connection hole. The further sealing element can also be made without a through hole. The further sealing element can then have, instead of the at least one through hole, at least one groove for guiding the at least one electrical connection element. The further sealing element then offers the advantage that the contact section, or the at least one connection hole, can be reliably sealed off from both main surfaces of the printed circuit board. In this manner, all connections, pins or lead frames, as well as all intermediate spaces, are sealed off from the printed circuit board in the contact section.

In this case, the further sealing element can have numerous through holes disposed adjacent to one another for inserting numerous electrical connection elements disposed adjacent to one another. The sealing element can also have numerous blind holes disposed adjacent to one another for receiving numerous end sections of the numerous electrical connection elements disposed adjacent to one another. Moreover, numerous connection holes disposed adjacent to one another can be disposed in the contact section of the printed circuit board. In this context, the printed circuit board can have numerous connection holes, which are disposed adjacent to one another along at least one side edge of the printed circuit board in the contact section, disposed in a single row, or in numerous rows. Along a first lateral edge of the printed circuit board, a first plurality of connection holes can be disposed in a first contact section, and, by way of example, along at least a further side edge of the printed circuit board, at least a further plurality of connection holes can be disposed in a further contact section. One single connection hole serves for the establishing of an electrical and mechanical connection to one single electrical connection element. Thus, numerous electrical connection elements can also be connected to the printed circuit board. The plurality of through holes disposed adjacent to one another, in the further sealing element, the plurality of electrical connection elements disposed adjacent to one another, the plurality of blind holes in the sealing element disposed adjacent to one another, and the plurality of connection holes in the printed circuit board, disposed adjacent to one another, can be disposed in a single row, or in numerous rows. A connecting line for the at least one row of through holes, blind holes, connection holes and electrical connection elements can extend thereby along a straight line. Connecting lines of individual rows can also extend parallel to one another, from through holes, blind holes, connection holes and electrical connection elements. A number and configuration of the blind holes can correspond to a number and configuration of the connection holes. The configuration of the connection holes can correspond to the configuration of the connection elements, wherein the number and configuration of the connection holes can be equal to or greater than the number of connection elements. An embodiment of this type offers the advantage that numerous electrical connection elements, by means of which an electrical connection to one or numerous peripheral modules can be established, can also be connected to the printed circuit board. Even when there are numerous electrical connection elements, the covering and sealing by means of the cover device remains cost-effective and the assembly thereof remains simple.

The present invention furthermore provides a control system for a mechatronics module, wherein the control system has the following features:

a printed circuit board with at least one connection hole disposed in a contact section of the printed circuit board;

at least one electrical connection element, which is connect to the at least one connection hole in the printed circuit board; and a cover device, specified above, wherein the cover device is attached to the printed circuit board such that it seals the at least one connection hole.

The aforementioned sealing device can be advantageously implemented or used in conjunction with the control system. The at least one peripheral module can be a sensor assembly, an actuator assembly, e.g. a valve assembly, or suchlike. The at least one peripheral module can have an electrical contact via at least one electrical connection of the peripheral module, by means of the at least one electrical connection element. If the at least one electrical connection element is designed to extend through the printed circuit board by means of the contact hole, thus having a protruding end section, then protection against contaminants and short circuits for the at least one electrical connection element can be ensured by means of the voltage protection element and the sealing element.

According to one embodiment, the voltage protection element of the cover device is connected in a liquid-tight manner to the printed circuit board. In this manner, a connection of the voltage protection element to the printed circuit board can be sealed against liquids, particles and suchlike. The voltage protection element can be designed to be suitably connected in a sealed manner to the printed circuit board. In order to even better protect the contact section, or the at least one connection hole and the end section of the at least one electrical connection element, respectively, from permeation by, for example, oil or other liquids or contaminants, the voltage protection element can be placed in a sealed manner on the printed circuit board. An embodiment of this type offers the advantage that a sealing effect of the cover device can be further improved, and a protective function, implemented in a two-step manner, from contaminants and short circuits and suchlike, can be created by means of the sealing element and the voltage protection element. In this manner, the voltage protection element can provide protection against mechanical loads as well as protection against the permeation of liquids.

The at least one electrical connection element can be a part of a connector device, a connector, or suchlike. The further sealing element of the cover device can be disposed thereby between the printed circuit board and the connector device. Attachment means for attaching the voltage protection element and/or the at least one electrical connection element, or the connector device, respectively, can also be provided on the printed circuit board. The attachment means can be, for example, screws, threaded holes, adhesive, locking elements, rivets or suchlike. In this manner, the voltage protection element and/or a connector device can be securely and reliably attached to the printed circuit board.

In addition, a relative movement of the at least one electrical connection element in relation to the printed circuit board, e.g. resulting from vibrations, can be prevented. Thus, the voltage protection element can be designed such that it is connected in a suitable manner to the printed circuit board and/or the connector device.

The present invention furthermore provides for a use of a sealing element having at least one blind hole for sealing at least one connection hole disposed in a contact section of a printed circuit board, and for receiving an end section of at least one electrical connection element in the at least one blind hole.

The present invention furthermore provides a method for assembling a control system for a mechatronics module, wherein the method comprises the following steps:

provision of a printed circuit board having at least one connection hole disposed in a contact section of the printed circuit board;

provision of an aforementioned cover device;

inserting an end section of an electrical connection element through the at least one connection hole of the printed circuit board; and installing the cover device on the printed circuit board, wherein the end section of the electrical connection element is accommodated in the at least one blind hole in the sealing element.

A control system, as described above, can be advantageously installed by executing the method. Numerous electrical connection elements can also be provided, which, for example, can be consolidated in a connector. Prior to, or during the insertion step, the further sealing element for the cover device can be pressed onto the printed circuit board. Then, in the insertion step the end section of the electrical connection element can be inserted through the at least one through hole in the further sealing element, and through the at least one connection hole in the printed circuit board. Alternatively, the further sealing element for the cover device can be connected to a connector device having the electrical connection element prior to the insertion. In the installation step, the sealing element can be pressed onto the printed circuit board. Then, the voltage protection element can be connected to the printed circuit board. Then, the sealing element and the voltage protection element can be connected to the printed circuit board. It is also possible to execute the insertion step and the installation step, at least in part, simultaneously. Pressure can be applied to both sides of the printed circuit board thereby, such that one-sided loads can be minimized, and sealing effects can be improved.

According to one embodiment, the sealing element can be pressed onto the printed circuit board by means of the voltage protection element for the cover device during the installation step. An embodiment of this type offers the advantage that there is no need for a tool for the pressing, because the voltage protection element can serve as a pressing tool. By this means, a secure, uncomplicated and reliable protection against contamination and suchlike can be established for the at least one electrical connection element, or the at least one connection hole, respectively.

Figure 2:
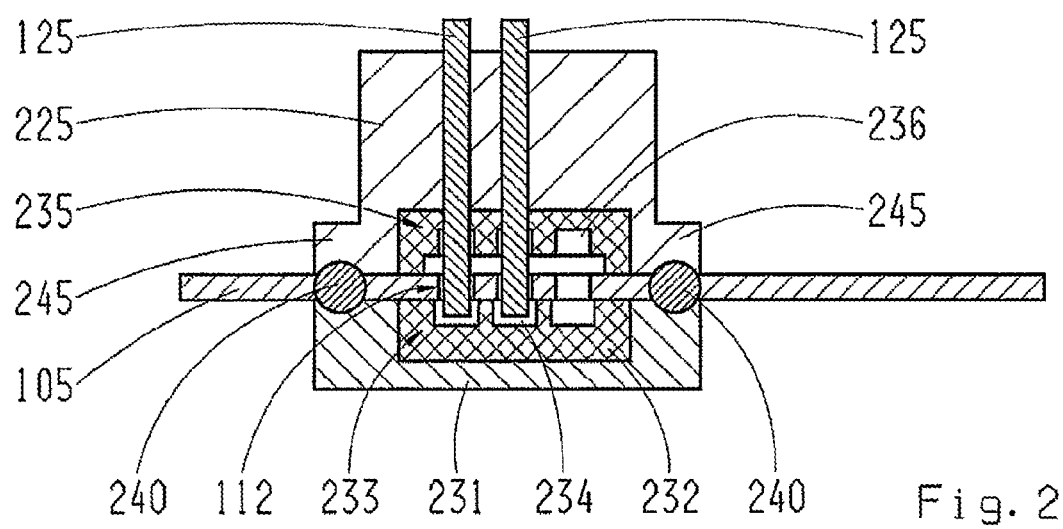
Figure 3:
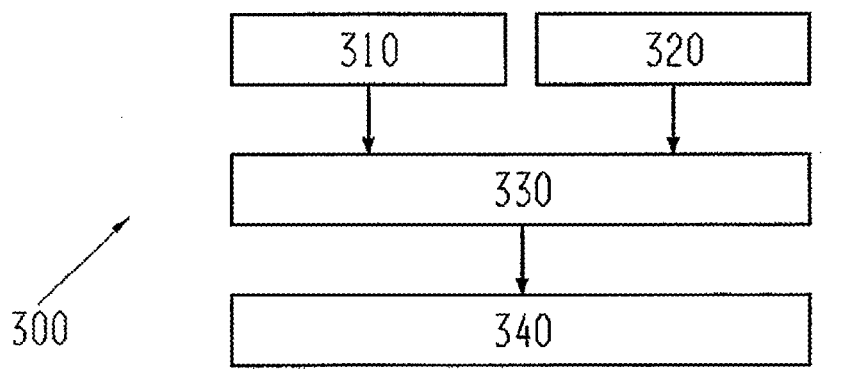

The invention shall be explained in greater detail, in an exemplary manner, based on the attached drawings. Shown are:

FIG. 1 a control system with a cover device according to one embodiment example of the present invention;

FIG. 2 a part of a control system with a cover device according to one embodiment example of the present invention;

FIG. 3 a flow chart for a method according to one embodiment example of the present invention; and FIGS. 4A-4D different views of a part of a control system with a cover device according to one embodiment example of the present invention.

In the following description of preferred embodiment examples of the present invention, the same or similar reference symbols shall be used for the elements depicted and having similar functions in the different figures, wherein the description of these elements shall not be repeated.

FIG. 1 shows a schematic depiction of a control system 100 according to one embodiment example of the present invention. The control system 100 has a printed circuit board 105 and a peripheral module 110. The printed circuit board 105 has a contact section 111. Two connection holes 112 are disposed in the contact section 111. The peripheral module 110 is electrically connected to the printed circuit board 105 by means of two electrical conductors. The electrical conductors can be wires, cables or suchlike. End sections of the electrical conductors are designed as electrical connection elements 125, or connected to electrical connection elements 125, e.g. a connector. Two electrical connection elements 125 are shown, each of which is inserted through one of the connection holes 112. The printed circuit board has a cover device 130 for covering the contact section 111. In differing from the depiction in FIG. 1, the control system 100 can have a different number of connection holes 112, peripheral modules 110, electrical connection elements 125 and/or cover devices 130. The control system 100 can be a part of a mechatronics module for a transmission control or a steering control in a vehicle. The printed circuit board 105 can be a part of a control device for the control system 100.

The peripheral module 110 is connected to the connection holes 112 of the printed circuit board 105 by means of the electrical connection elements 125. In particular, the peripheral module 110 is electrically and mechanically connected to the connection holes 112 of the printed circuit board 105 by means of the electrical connection elements 125. A first of the electrical connection elements 125 is connected thereby to a first of the connection holes 112. A second of the electrical connection elements 125 is connected to a second of the connection holes 112.

The cover device 130 is connected to the printed circuit board 105. The cover device 130 is designed thereby to seal and cover the connection holes 112, or end sections of the electrical connection elements 125, respectively, disposed in the contact section 111. The cover device 130 shall be explained in greater detail below with reference to FIG. 2.

FIG. 2 shows a part of a control system having a cover device according to one embodiment example of the present invention. The control device and the cover device can be the control device and the cover device from FIG. 1. A printed circuit board 105 is shown, having, by way of example, three connection holes 112, two connection elements 125 as components of a connector device 225, and one cover device. The cover device has a voltage protection element 231 with a covering space 232, a sealing element 233, or an elastomer sealing mat, respectively, with three blind holes 234, by way of example, and a further sealing element 235, or a further elastomer sealing mat, respectively, with three through holes 236, by way of example. Moreover, two attachment means 240 and two attachment projections 245 are shown, by means of which the connector device 225 and the voltage protection element 231 are connected to one another and to the printed circuit board 105.

The connection holes 112 in the printed circuit board 105 are formed as through holes from a first main surface of the printed circuit board 105, the lower main surface depicted in FIG. 2, to a second main surface of the printed circuit board 105, the upper main surface depicted in FIG. 2. The connection holes 112 are designed to enable, for example, a solder or insertion connection with the electrical connection elements 125.

The electrical connection elements 125 can be or have, for example, connection pins, contact pins, parts of a lead frame, or wires. The electrical connection elements 125 are received in the connector device 225. The connector device can be, e.g. a plastic retaining element, a plastic housing, or suchlike, for the electrical connection elements 125. The connector device 225 is attached to the second main surface of the printed circuit board 105, the upper main surface depicted in FIG. 2. A partially enclosed receiving space, opening toward the second main surface of the printed circuit board 105, is disposed in the connector device 225. The further sealing element 235 for the cover device is disposed in the receiving space of the connector device 225. The further sealing element 235 is thus disposed between the connector device 225 and the second main surface of the printed circuit board 105. The further sealing element 235 is disposed in a sealing manner on a contact region on the second main surface of the printed circuit board 105. Only the edge sections of the connector device 225 rest on the second main surface of the printed circuit board. The through holes 236 of the further sealing element 235 are aligned with the connection holes 112 of the printed circuit board 105. The two electrical connection elements 125 extend through the connector device 224, through two of the three depicted through holes 236 of the further sealing element 235, and through the connection holes 112 of the printed circuited board 105.

The voltage protection element 231, or the voltage protection cover, or base, respectively, can be made of aluminum or plastic, for example. The voltage protection element 231 is attached to the first main surface of the printed circuit board 105, the lower main surface shown in FIG. 2. The voltage protection element 231 has a U-shaped cross-section profile. The partially enclosed covering space, opening toward the first main surface of the printed circuit board 105 is disposed in the voltage protection element 231. The sealing element 233 for the cover device is disposed in the covering space 232 of the voltage protection element 231. The sealing element 233 is thus disposed between the voltage protection element 231 and the first main surface of the printed circuit board 105. The sealing element 233 is disposed in a sealing manner in a contact region on the first main surface of the printed circuit board 105. Only the edge sections of the voltage protection element 231 rest on the first main surface of the printed circuit board. The blind holes 234 of the sealing element 233 are aligned with the connection holes 112 of the printed circuit board 105. The two electrical connection elements 125 extend through the connection holes 112 of the printed circuit board 105. End sections of the electrical connection elements 125 extend over the first main surface of the printed circuit board 105, into the blind holes 234 of the sealing element 233.

The attachment means 240 and attachment projections 245 are designed to enable a mechanical connection of the voltage protection element 231 and the connector device 224 to one another and to the printed circuit board 105, e.g. by means of adhesive, screws, rivets, laser welds, hot glue, etc. The attachment means 240 connect the edge sections of the voltage protection element 231 resting on the printed circuit board, and the connector device 225 to one another, and to the printed circuit board 105. The attachment means 240 are designed having multiple parts, by way of example. The attachment means 240 have, in particular, attachment projections 245 on the connector device 225, attachment elements on the voltage protection element 231 and/or attachment means 240 provided separately, such as, e.g. screws, rivets or suchlike.

FIG. 3 shows a flow chart for a method 300 for assembling a control system for a mechatronics module, in accordance with one embodiment example of the present invention. In a step 310, a printed circuit board is provided, having at least one connection hole disposed in a contact section of the printed circuit board. In a step 320, a cover device is provided for a contact section of a printed circuit board for a mechatronics module. The cover device has a voltage protection element and a sealing element thereby, for sealing the at least one connection hole. The sealing element has at least one blind hole for receiving an end section of at least one electrical connection element. In a step 330, an end section of an electrical connection element is inserted through the at least one connection hole in the printed circuit board. The method 300 also has a step 340, for the installation of the cover device on the printed circuit board, wherein the end section of the electrical connection element is received in the at least one blind hole in the sealing element. By executing the method 300, a control system can be assembled, such as that shown and described in FIGS. 1 and 2, or FIGS. 4A-4D.

FIG. 4A shows a part of a control system having a cover device according to one embodiment example of the present invention. More precisely, FIG. 4A shows a perspective view of a part of a control system having a cover device in an assembled state. The control device and the cover device can be the control device and the cover device in FIG. 2, with the exception that in FIG. 4A, by way of example, six electrical connection elements 125, designed as electrical cables, are provided. Even when it is not explicitly depicted in FIG. 4A, the electrical connection elements 125 are received in the connector device 225, bent at a right angle. Moreover, six connection holes can be disposed in the printed circuit board 105, six blind holes can be disposed in the sealing element, and six through holes can be disposed in the further sealing element, wherein, due to the perspective view, in the assembled state, the connection holes, the sealing element, the further sealing element, as well as the end sections of the electrical connection elements 125 are covered, or not visible.

FIG. 4B shows a part of the control system with the cover device from FIG. 4A. The depiction in FIG. 4*b* corresponds thereby to the depiction in FIG. 4A, aside from the fact that the control system and the cover device in FIG. 4B are shown from a different perspective than that shown in FIG. 4A, and that the voltage protection element 231 is depicted in a partial cutaway, such that the end sections of the electrical connection elements 125 received in the voltage protection element 231 can be seen. Moreover, the sealing element is removed from the voltage protection element 231, and thus not shown.

FIG. 4C shows a part of the control system with the cover device from FIG. 4A, or FIG. 4B, respectively. The depiction in FIG. 4C corresponds thereby to the depiction in FIG. 4A or FIG. 4B, with the exception that the connector device 225 is shown in a state, in which it is not attached to the printed circuit board 105, aligned with the six, by way of example, contact holes 112, visible in FIG. 4C, in the printed circuit board 105, and at a spacing to the printed circuit board 105. The voltage protection element 231 is also depicted at a spacing to the printed circuit board 105. Thus, FIG. 4C shows the part of the control system with the cover device from FIG. 4A, or FIG. 4B, respectively, in a partially exploded depiction, wherein the sealing element and the further sealing element are not shown.

FIG. 4D shows the part of the control system with the cover device from FIG. 4A, FIG. 4B, or FIG. 4C, respectively. Similarly to FIG. 4C, FIG. 4D shows the part of the control system with the cover device in a partially exploded depiction, but from a different perspective than that in FIG. 4C.

Various embodiment examples of the present invention shall be explained in summary below, with reference to FIGS. 1-3. Details such as "above," "below," etc. relate thereby to the configuration of the elements as they are shown in FIG. 2.

The cover device 130 can be a device for covering and sealing a connection point on a printed circuit board, or a connector or module of a control system 100. Electrical connection elements 125, e.g. lead frame, wire, pin or cable ends of peripheral modules 110, e.g. sensor, actuator, or connector modules, are inserted in the connection holes 112 of the printed circuit board 105, and soldered or designed as press-fit modules, and inserted into the connection holes 112 of the printed circuit board 105, or connected to the printed circuit board 105 in another manner, such that they can be released, or cannot be released, respectively.

In order to protect these electrical solder or insertion connections from media, e.g. transmission fluid, in accordance with one embodiment example, a sealing element 233, 235, designed as an elastomer component or rubber component, is used on both sides of the printed circuit board 105. This elastomer component or rubber component can be designed as a mat. The elastomer component on the lower side, i.e. the sealing element 233, has blind holes 234, which encompass the insertion or solder points in the region of the connection holes 112 in the printed circuit board 105. The elastomer component on the upper surface, i.e. the further sealing element 235, has, by way of example, either round or rectangular recesses, or through holes 236, respectively, or simple slits in the elastomer component, which encompass the individual connection elements 125. The further sealing element 235 can, e.g. be already integrated in a connector, or a connector device 225 that has one of the electrical connection elements 125.

Both sealing elements 233, 235 can be pressed onto the printed circuit board 105 by means of a suitable auxiliary part, e.g. made of plastic or metal. It is also possible to insert the element using the connector device 225, or a connector housing, and/or the voltage protection element 231, or the voltage protection cover, respectively. The two housing components, i.e. the voltage protection element 231 and the connector device 225, are pressed firmly onto the printed circuit board, such that the sealing elements 233, 235 securely enclose, in a sealing manner, the electrical connection elements 125, or all of the connections, pins, or lead frames, as well as all intermediate spaces on the printed circuit board 105. In order to achieve a voltage protection, or protection against short circuits between the individual electrical connection elements 125, or contacts, respectively, the voltage protection element 231 is attached to the lower side of the printed circuit board 105, opposite the connector device 225.

The embodiment examples described herein and shown in the figures are only selected by way of example. Different embodiment examples can be combined with one another, in their entirety, or with respect to individual features. It is also possible for one embodiment example to be supplemented with features from another embodiment example.

REFERENCE SYMBOLS 100 control system for a mechatronics module
105 printed circuit board
111 contact section
112 connection hole
110 peripheral module
125 electrical connection element
130 cover device
225 connector device
231 voltage protection element
232 covering space
233 sealing element
234 blind hole
235 further sealing element
236 through hole
240 attachment means
245 attachment projection
300 method for assembly
310 first providing step
320 second providing step
330 insertion step
340 installation step

The invention claimed is:

1. A cover device for covering a contact section of a printed circuit board of a mechatronics module, wherein the contact section comprises at least one connection hole for connecting an electrical connection element to the printed circuit board, the cover device comprising:
a voltage protection element adjacent a first surface of the printed circuit board and having opposing edge sections each contacting the first surface, the voltage protection element forming a covering space between the opposing edge sections;
a first sealing element disposed in the covering space, the first sealing element sealing the at least one connection hole when the cover device is assembled to the printed circuit board,
wherein the first sealing element comprises at least one blind hole configured to receive an end section of the at least one electrical connection element; and
a connector device adjacent a second surface of the printed circuit board opposite the first surface, the connector device having opposing edge sections each contacting the second surface, wherein each opposing edge section of the connector device is coupled to a respective edge section of the voltage protection element.

2. The cover device according to claim 1, wherein when the cover device is assembled to the printed circuit board, the first sealing element is disposed between the voltage protection element and the first surface of the printed circuit board.

3. The cover device according to claim 1, wherein the first sealing element comprises a sealing mat made of an elastomer material, and
wherein the first sealing element is pressed onto the contact section of the printed circuit board when the cover device is assembled to the printed circuit board.

4. The cover device according to claim 1, further comprising:
a receiving space formed between the opposing edge sections of the connector device; and
a second sealing element disposed in the receiving space and contacting the second surface of the printed circuit board, the second sealing element sealing the at least one connection hole when the cover device is assembled to the printed circuit board,
wherein the second sealing element comprises at least one through hole configured to receive the at least one electrical connection element when the cover device is assembled to the printed circuit board.

5. The cover device according to claim 4, wherein when the cover device is assembled to the printed circuit board,
the at least one electrical connection element is adjacently disposed on the contact section of the printed circuit board, and
the at least one through hole of the second sealing element and the at least one blind hole of the first sealing element are aligned with the at least one connection hole of the contact section to receive the at least one electrical connection element.

6. A control system for a mechatronics module, the control system comprising:
a printed circuit board comprising a first surface, a second surface opposing the first surface, and at least one connection hole disposed in a contact section of the printed circuit board and extending between the first surface and the second surface;
at least one electrical connection element extending through the at least one connection hole of the printed circuit board; and
a cover device attached to the printed circuit board in a sealing manner, the cover device comprising:
a voltage protection element having opposing edge sections each contacting the first surface of the printed circuit board;
a first sealing element between the voltage protection element and the first surface of the printed circuit board, the first sealing element configured to seal the at least one connection hole, the first sealing element comprising at least one blind hole into which an end section of the at least one electrical connection element is inserted; and
a connector device having opposing edge sections each contacting the second surface of the printed circuit board, wherein each opposing edge section of the connector device is coupled to a respective edge section of the voltage protection element.

7. The control system according to claim 6, wherein the voltage protection element forms a covering space between the opposing edge sections of the voltage protection element and the first sealing element is disposed in the covering space.

8. The control system according to claim 6, wherein a covering space is formed between the voltage protection element and the printed circuit board, wherein the covering space at least partially accommodates the first sealing element.

9. The control system according to claim 6, wherein the first sealing element comprises a sealing mat made of an elastomer material, and
wherein the first sealing element is pressed onto the contact section of the printed circuit board.

10. The control system according to claim 6, further comprising:
a receiving space formed between the opposing edge sections of the connector device; and
a second sealing element disposed in the receiving space and contacting the second surface of the printed circuit board, wherein the second sealing element seals the at least one connection hole from the second surface, and
wherein the second sealing element comprises at least one through hole into which the electrical connection element is inserted.

11. The control system according to claim 10, wherein the at least one electrical connection element is adjacently disposed on the contact section of the printed circuit board, the second sealing element comprises at least one adjacently disposed through hole into which the at least one electrical connection element is inserted, and the first sealing element comprises at least one adjacently disposed blind hole into which an end section of the at least one electrical connection element is inserted.

12. The control system according to claim 6, wherein the voltage protection element is connected in a liquid-tight manner to the printed circuit board.

* * * * *